(12) United States Patent
Okita

(10) Patent No.: US 11,101,112 B2
(45) Date of Patent: Aug. 24, 2021

(54) PLASMA PROCESSING DEVICE AND PLASMA PROCESSING METHOD

(71) Applicant: Panasonic Intellectual Property Management Co., Ltd., Osaka (JP)

(72) Inventor: Shogo Okita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 161 days.

(21) Appl. No.: 16/114,467

(22) Filed: Aug. 28, 2018

(65) Prior Publication Data

US 2019/0066981 A1    Feb. 28, 2019

(30) Foreign Application Priority Data

Aug. 30, 2017   (JP) .............................. JP2017-165620

(51) Int. Cl.
*H01J 37/32*       (2006.01)
*H01L 21/683*      (2006.01)
(Continued)

(52) U.S. Cl.
CPC .. *H01J 37/32522* (2013.01); *H01J 37/32449* (2013.01); *H01J 37/32651* (2013.01);
(Continued)

(58) Field of Classification Search
None
See application file for complete search history.

(56) References Cited

U.S. PATENT DOCUMENTS 5,094,885 A * 3/1992 Selbrede ................. C23C 16/04
                                                      118/715
5,775,416 A * 7/1998 Heimanson ............ C23C 14/50
                                                      118/725
(Continued)

FOREIGN PATENT DOCUMENTS

JP    2014-513868 A    6/2014
JP    2017-073569 A    4/2017
(Continued)

OTHER PUBLICATIONS

IP.com search report (Year: 2020).*
Japanese Office Action issued in Japanese Patent Application No. JP2017-165620 dated Apr. 27, 2021.

*Primary Examiner* — Rakesh K Dhingra
(74) *Attorney, Agent, or Firm* — Pearne & Gordon LLP

(57) ABSTRACT

A plasma processing device has a chamber that can be depressurized, a plasma source to generate plasma in the chamber, a stage in the chamber on which the conveyance carrier is placed, and a cover on the stage to cover a holding sheet and a frame and including a window portion penetrating a thickness direction. The cover includes an introduction port, a discharge port, and a coolant flow path connecting the introduction port and the discharge port and not overlapping with a region on an inner side of the frame in plan view. The stage includes a supply port communicated with the introduction port to allow supply of coolant to the coolant flow path when the cover is on the stage, and a recovery port communicated with the discharge port to allow recovery of coolant supplied to the coolant flow path when the cover is on the stage.

4 Claims, 7 Drawing Sheets

(51) Int. Cl.
*H01L 21/677* (2006.01)
*H01L 21/78* (2006.01)
*H01L 21/67* (2006.01)

(52) U.S. Cl.
CPC .. *H01J 37/32697* (2013.01); *H01J 37/32724* (2013.01); *H01J 37/32834* (2013.01); *H01L 21/67109* (2013.01); *H01L 21/67772* (2013.01); *H01L 21/6831* (2013.01); *H01L 21/6833* (2013.01); *H01L 21/6836* (2013.01); *H01L 21/78* (2013.01); *H01J 2237/002* (2013.01); *H01J 2237/2001* (2013.01); *H01J 2237/334* (2013.01); *H01L 2221/68327* (2013.01)

(56) References Cited

U.S. PATENT DOCUMENTS

| | | | | |
|---|---|---|---|---|
| 2004/0261946 | A1* | 12/2004 | Endoh | H01J 37/32082 156/345.15 |
| 2010/0326600 | A1* | 12/2010 | Park | H01J 37/32091 156/345.37 |
| 2012/0160808 | A1* | 6/2012 | Kikuchi | H01L 21/6831 216/67 |
| 2012/0228261 | A1* | 9/2012 | Watanabe | H01J 37/32357 216/41 |
| 2012/0238073 | A1* | 9/2012 | Johnson | H01L 21/68742 438/464 |
| 2014/0332497 | A1* | 11/2014 | Nishizaki | H01L 21/67069 216/67 |
| 2015/0122776 | A1* | 5/2015 | Okita | H01L 21/67069 216/67 |
| 2015/0340203 | A1* | 11/2015 | Matsubara | H01L 21/6833 216/67 |
| 2016/0064196 | A1* | 3/2016 | Okita | H01J 37/32366 216/58 |

FOREIGN PATENT DOCUMENTS

| | | |
|---|---|---|
| JP | 2017-518637 A | 7/2017 |
| WO | 2012-125560 A2 | 9/2012 |
| WO | 2012-125560 A3 | 9/2012 |
| WO | 2015/175267 A1 | 11/2015 |

* cited by examiner

PLASMA PROCESSING DEVICE AND PLASMA PROCESSING METHOD

CROSS-REFERENCE TO RELATED APPLICATION

This application claims priority of Japanese Patent Application No.: 2017-165620 filed on Aug. 30, 2017, the content of which is incorporated herein by reference.

BACKGROUND OF THE INVENTION

Technical Field

The present invention relates to a plasma processing device and a plasma processing method.

Description of the Related Art

In a conventionally known plasma processing device, a wafer (substrate) to which a dicing tape (annular frame) is attached has been cooled through electrostatic attraction in close contact on a cooled electrode (refer to Japanese Patent Laid-open No. 2014-513868, for example).

However, the cooling in close contact on the electrode is insufficient in some cases, causing heat damage due to plasma on the dicing tape and the wafer.

SUMMARY OF THE INVENTION

An object of the present invention is intended to provide a plasma processing device and a plasma processing method that are capable of efficiently cooling a frame or a substrate to avoid heat damage.

An aspect of the present invention provides a plasma processing device configured to perform plasma processing on a substrate being held by a conveyance carrier including an annular frame and a holding sheet, the plasma processing device comprising: a chamber including an internal space that can be depressurized; a plasma source configured to generate plasma in the chamber; a stage that is provided in the chamber and on which the conveyance carrier is placed; and a cover placed on the stage to cover the holding sheet and the frame and including a window portion penetrating a thickness direction. The cover includes an introduction port, a discharge port, and a coolant flow path connecting the introduction port and the discharge port and not overlapping with a region on an inner side of the frame in plan view. The stage includes a supply port communicated with the introduction port to allow supply of coolant to the coolant flow path when the cover is placed on the stage, and a recovery port communicated with the discharge port to allow recovery of coolant supplied to the coolant flow path when the cover is placed on the stage.

The present invention can prevent heat damage on a substrate or a frame by cooling a cover. Moreover, no coolant flow path is formed in a region on the inner side of a frame, thereby preventing such failure that the inner side of the cover is excessively cooled and deposition generated in plasma processing adheres to the lower surface of the cover.

DETAILED DESCRIPTION OF THE PREFERRED EMBODIMENTS

An embodiment of the present invention will be described below in accordance with the accompanying drawings. Terms indicating particular directions and positions (for example, terms including "up", "down", "side", and "edge") are used as necessary in the following description to facilitate understanding of the invention with reference to the drawings. The technical scope of the present invention is not limited by the meaning of the terms. The following description is essentially exemplary and not intended to limit the present invention, application, nor usage thereof. The drawings are schematically illustrated, and any ratio of dimensions or the like may be different from that in reality.

Figure 1:
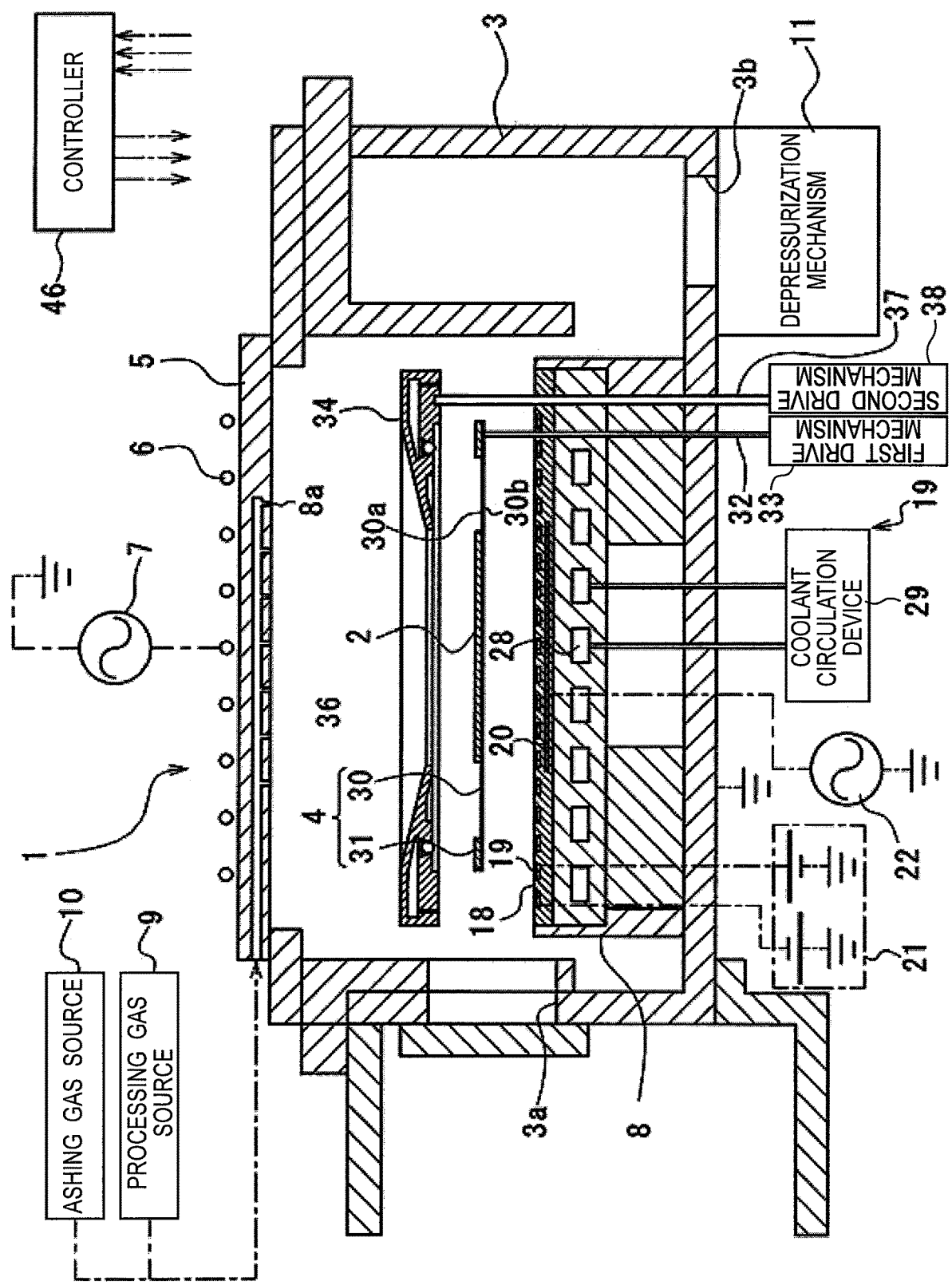
FIG. 1 is a front sectional view schematically showing a plasma processing device according to an embodiment.

FIG. 1 illustrates a plasma processing device 1 according to the present embodiment. The plasma processing device 1 is configured to perform plasma processing on a wafer 2 (substrate), and includes a chamber 3 including an internal space that can be depressurized, in other words, a processing chamber. A conveyance carrier 4 holding the wafer 2 can be conveyed into and out of the processing chamber through a gateway 3a.

The top of the chamber 3 (vacuum vessel) is closed by a dielectric wall 5. An antenna 6 (plasma source) as an upper electrode is disposed above the dielectric wall 5. The antenna 6 is electrically connected with a first high-frequency (radio-frequency: RF) power supply unit 7. A stage 8 is disposed on the bottom side in the chamber 3. A gas introduction port 8a of the chamber 3 is connected with a processing gas source 9 and an ashing gas source 10. A discharge port 3b of the chamber 3 is connected with a depressurization mechanism 11 including a vacuum pump for performing vacuum discharge of the chamber 3 and a pressure adjustment valve for adjusting the pressure in the chamber 3.

Figure 2:
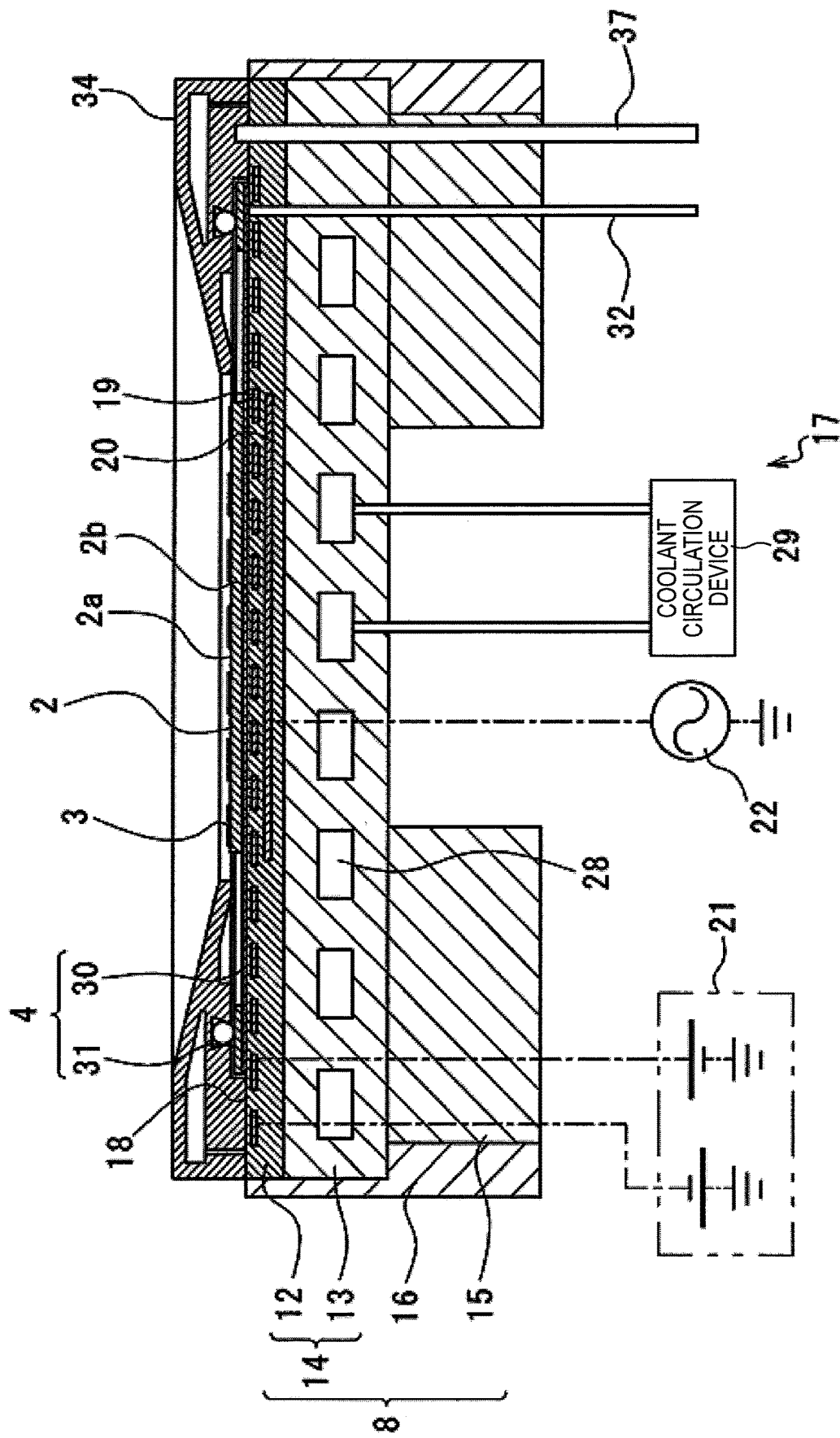
FIG. 2 is an enlarged view of a stage of FIG. 1.

As illustrated in FIG. 2, the stage 8 includes an electrode unit 14 including an electrostatic chuck 12 and an electrode unit body 13 disposed therebelow, a base unit 15 disposed below the electrode unit body 13, and an exterior unit 16 surrounding these units. The stage 8 is provided with a cooling device 17.

The electrostatic chuck 12 of the electrode unit 14 is a sheet (tape) made of thin ceramic, sprayed ceramic, or dielectric material. The electrostatic chuck 12 has an upper surface serving as a placement receiving surface 18. The conveyance carrier 4 holding the wafer 2 is placed at a central portion of the placement receiving surface 18. A cover 34 to be described later is placed at an outer peripheral portion of the placement receiving surface 18. The electrostatic chuck 12 includes an electrostatic attraction electrode 19 of a bipolar type on the upper side, and a high-frequency (RF) electrode 20 on the lower side. The electrostatic attraction electrode 19 is electrically connected with a direct-current power source 21. The RF electrode 20 is electrically connected with a second high-frequency power supply unit 22.

Figure 3:
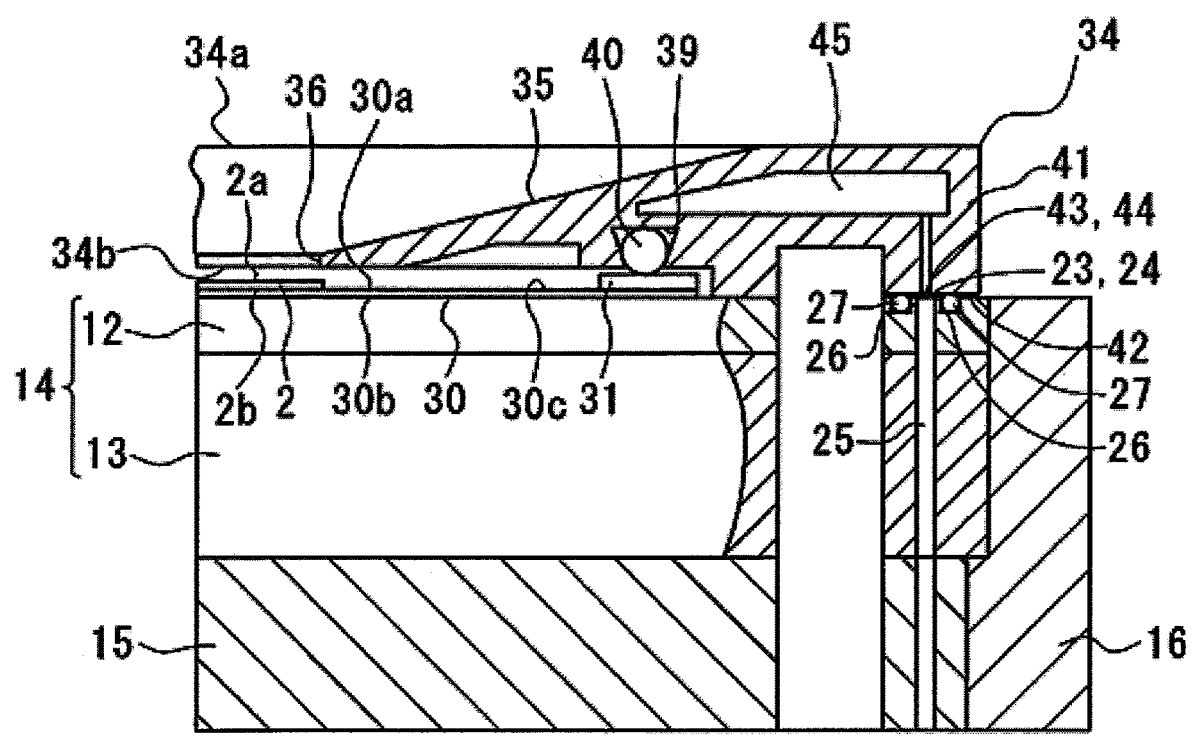
FIG. 3 is a partial enlarged view of a cover and the stage of FIG. 2.
Figure 4:
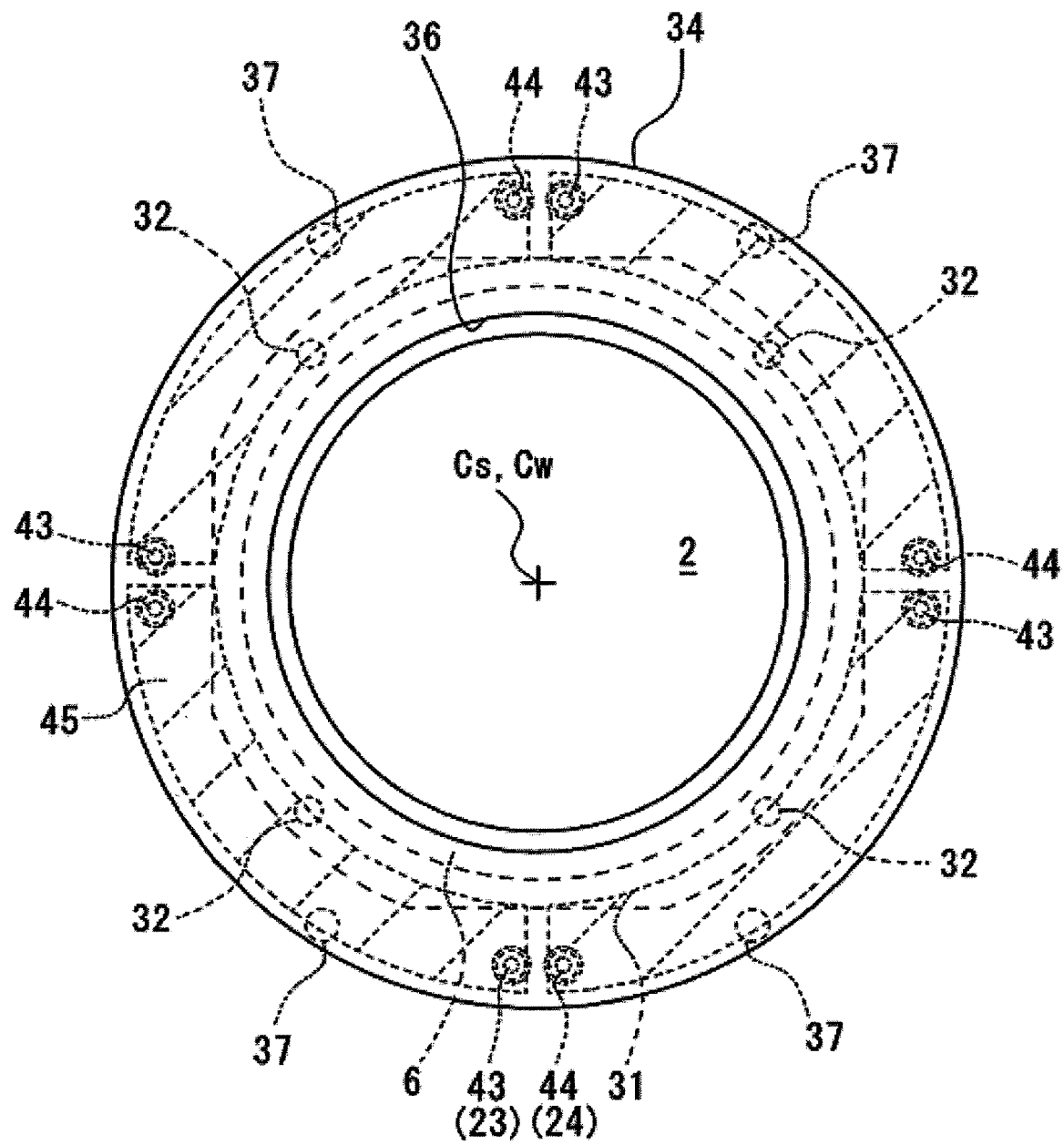
FIG. 4 is a plan view of the cover of FIG. 1.

The electrode unit body 13 is made of metal (for example, aluminum alloy). As illustrated in FIG. 3, a communication through-hole 25 is formed in the electrostatic chuck 12 and the electrode unit body 13 to provide a supply port 23 and a recovery port 24 opened at a contact surface with the cover 34. Coolant gas (in this example, He gas) is supplied to the cover 34 through the communication through-hole 25. As illustrated in FIG. 4, pairs of the supply port 23 and the recovery port 24 are formed at four places equally separated from each other in the circumferential direction. A seal portion is formed on the upper surface of the electrostatic chuck 12 to surround each of the supply ports 23 and the recovery ports 24.

When mechanical force that presses the cover 34 toward the stage 8 can be applied to the cover 34 through a second drive rod 37 and the like illustrated in FIG. 1 (clamp type), the seal portion includes an annular groove 26 formed on the upper surface of the electrostatic chuck 12 to surround each of the supply ports 23 and the recovery ports 24, and an O-ring 27 disposed in the annular groove 26 as illustrated in FIG. 3. In this case, when pressed toward the stage 8 by the mechanical force, the cover 34 closely contacts with the stage 8 through the O-ring 27, thereby achieving reliable sealing of the coolant gas.

Figure 7A:
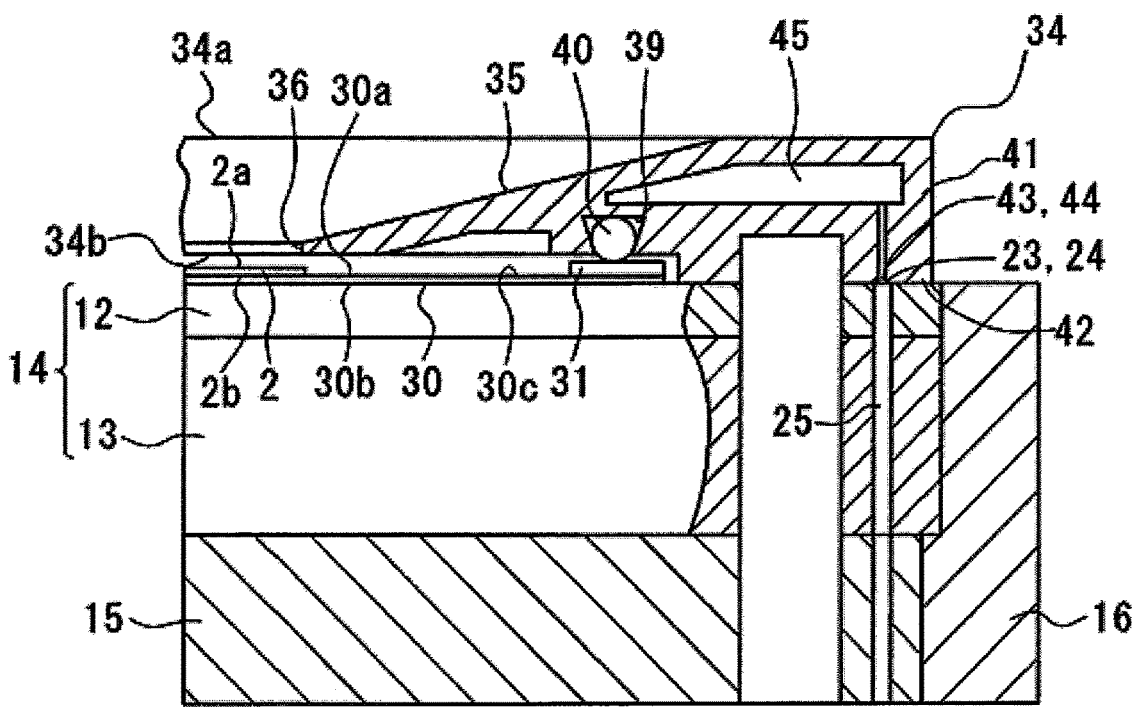
FIG. 7A is a partial enlarged view of the cover and the stage according to further another embodiment.
Figure 7B:
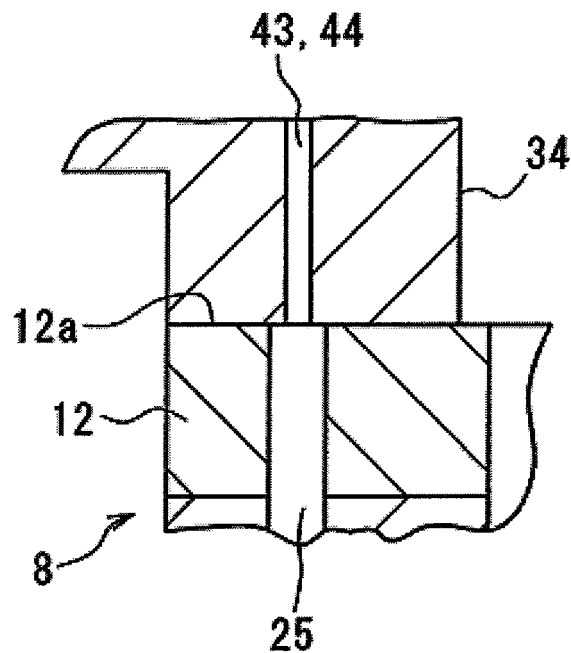
FIG. 7B is a partial enlarged view showing an example of a part of FIG. 7A.
Figure 7C:
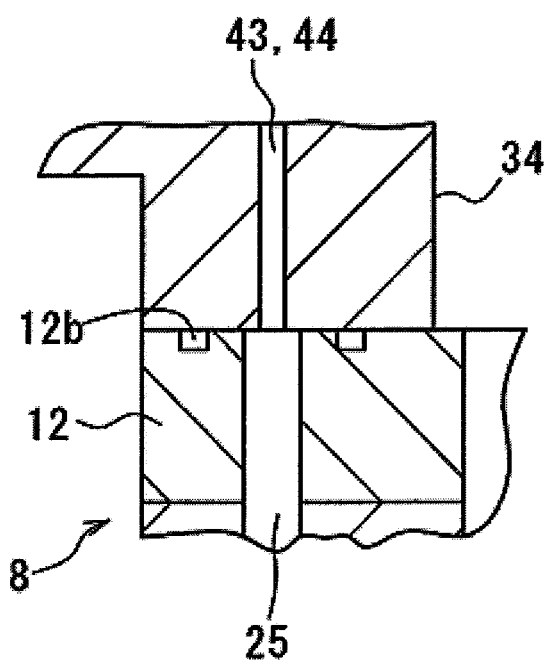
FIG. 7C is a partial enlarged view showing another example of the part of FIG. 7B

When the force applied to the cover 34 to press the cover 34 toward the stage 8 can be replaced with electromagnetic force acting between the cover 34 and the stage 8 (for example, an electrostatic attraction method), the seal portion may be formed on the upper surface of the electrostatic chuck 12 to surround each of the supply ports 23 and the recovery ports 24 as illustrated in FIG. 7A. The seal portion is, for example, a flat portion 12a illustrated in FIG. 7B or an annular seal pattern 12b illustrated in FIG. 7C. In this case, the electromagnetic force, for example, electrostatic attraction force generated by an electrostatic attraction electrode included in the stage 8 causes the cover 34 to closely contact with the stage 8 at the flat portion or the annular seal pattern formed to surround each of the supply ports 23 and the recovery ports 24, thereby achieving reliable sealing of the coolant gas.

The force applied to the cover 34 to press the cover 34 toward the stage 8 is not limited to that achieved by the clamp type nor the electrostatic attraction method. For example, the clamp type and the electrostatic attraction method may be both employed.

As illustrated in FIG. 2, the cooling device 17 includes a first coolant flow path 28 and a coolant circulation device 29. The coolant circulation device 29 causes coolant at an adjusted temperature to circulate through the first coolant flow path 28, thereby maintaining the stage 8 at a desired temperature.

The exterior unit 16 is made of an earth shielding member (conductive and etching-resistant metal). The exterior unit 16 protects the electrode unit 14 and the base unit 15 from plasma.

The conveyance carrier 4 includes a holding sheet 30 configured to detachably hold the wafer 2. The holding sheet 30 may be, for example, what is called an UV tape that is elastically extensible and holds the wafer 2 by adhesive force that significantly decreases due to chemical characteristic change through ultraviolet irradiation. As illustrated in FIG. 3, one of surfaces of the holding sheet 30 is an adhesive surface 30a, and the other surface is a non-adhesive surface 30b. The holding sheet 30 is flexible enough to easily become distorted and cannot maintain a constant shape by itself. Thus, a thin frame 31 (annular frame) having a substantially ring shape is bonded to the adhesive surface 30a near the outer periphery of the holding sheet 30. The frame 31 is made of, for example, metal and has stiffness with which the shape thereof can be maintained.

The wafer 2 is held at the center of a circular region 30c surrounded by the frame 31 on the adhesive surface 30a of the holding sheet 30. Specifically, the position of the wafer 2 is set relative to the holding sheet 30 so that the center of the wafer 2 substantially coincides with the center of the circular region 30c (refer to FIG. 4).

The conveyance carrier 4 is placed on the electrode unit 14 of the stage 8 while the surface (adhesive surface 30a) of the holding sheet 30 on which the wafer 2 is held faces upward, and accordingly, the non-adhesive surface 30b of the holding sheet 30 contacts with an upper surface of the electrode unit 14. The conveyance carrier 4 is placed in a predetermined posture (including a rotation angle about a center Cs of the holding sheet 30) at a predetermined position (legitimate position) relative to the electrode unit 14 by a conveyance mechanism (not illustrated).

The conveyance carrier 4 being placed at the legitimate position is moved up by a first drive rod 32 and discharged after processing to be described later. The first drive rod 32 is driven to move up and down by a first drive mechanism 33, which is conceptually illustrated only in FIG. 1, thereby moving the conveyance carrier 4 to a moved-up position illustrated in FIG. 1 and a moved-down position illustrated in FIG. 2.

The cover 34 configured to move up and down relative to the stage 8 is provided in the chamber 3. The cover 34 has a circular outer profile and is disposed so that the center thereof substantially coincides with the center of the circular region 30c and the center of the wafer 2. In plasma processing, the cover 34 covers the holding sheet 30 and the frame 31 of the conveyance carrier 4 to protect these components from plasma. For this purpose, the cover 34 is formed to be sufficiently larger than the outer profile of the conveyance carrier 4.

As illustrated in FIG. 3, the cover 34 is provided with, on an upper surface thereof, a tapered recess 35, the height of which gradually decreases toward a central portion. A window portion 36 penetrating from an upper surface 34a to a lower surface 34b in the thickness direction is formed at the central portion of the tapered recess 35. The window portion 36 has such size and shape that the holding sheet 30 on the conveyance carrier 4 is unlikely to be directly exposed to plasma generated as described later.

As illustrated in FIGS. 1 and 3, the cover 34 has a lower surface coupled with the second drive rod 37 penetrating through the stage 8. The cover 34 can be moved up and down between the moved-up position and the moved-down position through the second drive rod 37 by driving a second drive mechanism 38.

A plurality (in this example, four) of recesses 39 having an undercut structure are formed on the lower surface of the cover 34 at places equally separated from each other on an imaginary circle centered at the center of the lower surface of the cover 34. A plurality of pressing bodies 40 are disposed in the respective recesses 39, serving as a pressing unit. Each pressing body 40 may be made of a substantially cylindrical elastic material (for example, special fluorine rubber). When the cover 34 moves in the moved-down position, the pressing bodies 40 contact with the frame 31 of the conveyance carrier 4 by pressing. Any distortion of the frame 31 is corrected through the contact by pressing, and the frame 31 reliably contacts with the placement receiving surface 18 through the holding sheet 30. Accordingly, anomalous electrical discharging and insufficient cooling of the conveyance carrier 4, which are attributable to distortion of the frame 31, can be prevented.

A placement portion 41 protruding downward is formed at an outer peripheral portion of the cover 34. The placement portion 41 has a lower surface serving as a placement surface 42 to be placed on the upper surface of the electrostatic chuck 12. The placement surface 42 is provided with an introduction port 43 and a discharge port 44 communicated with the supply port 23 and the recovery port 24 of the electrostatic chuck 12, respectively. When the placement surface 42 of the cover 34 is placed on the placement receiving surface 18 of the electrostatic chuck 12, the supply port 23 and the recovery port 24 are communicated with the introduction port 43 and the discharge port 44, respectively, in sealed states through the O-rings 27. The introduction port 43 and the discharge port 44 are connected with a second coolant flow path 45. As illustrated in FIG. 4, the second coolant flow path 45 connects not the introduction port 43 and the discharge port 44 adjacent to each other but the introduction port 43 and the discharge port 44 separated from each other by ¼ of the circumference, and is formed at each of four places separated from each other by ¼ of the circumference approximately (refer to each hatched region in FIG. 4). Each second coolant flow path 45 is not formed in the inner side of the cover 34, specifically, not formed on the inner side of a position facing to the frame 31 in plan view, in other words, at a position facing to the circular region 30c. This configuration prevents excessive cooling of an inner side region of the cover 34 (a portion facing to the frame 31).

A control device 46 schematically illustrated only in FIG. 1 controls operation of each component of the plasma processing device 1 including the first high-frequency power supply unit 7, the processing gas source 9, the ashing gas source 10, the depressurization mechanism 11, the direct-current power source 21, the second high-frequency power supply unit 22, the coolant circulation device 29, the first drive mechanism 33, and the second drive mechanism 38.

The following describes operation of the plasma processing device 1 according to the present embodiment.

First, the conveyance carrier 4 on which the wafer 2 is bonded at the center of the circular region of the holding sheet 30 is conveyed into the chamber 3 by the conveyance mechanism (not illustrated) and disposed at the legitimate position on the stage 8. In this state, the cover 34 is positioned at the moved-up position (FIG. 1).

Then, the second drive rod 37 is driven by the second drive mechanism 38 to move the cover 34 from the moved-up position (FIG. 1) to the moved-down position (FIG. 2). When the cover 34 is positioned at the moved-down position, the holding sheet 30 and the frame 31 of the conveyance carrier 4 are covered by the cover 34 while the wafer 2 is exposed through the window portion 36. The cover 34 is in contact with the electrode unit 14. In this state, the supply port 23 and the recovery port 24 are communicated with the introduction port 43 and the discharge port 44, respectively.

Subsequently, direct-current voltage from the direct-current power source 21 is applied to the electrostatic attraction electrode 19 so that the wafer 2 is held on the upper surface of the electrode unit 14 of the stage 8 by electrostatic attraction. In this state, the electrostatic attraction electrode 19 is disposed near the lower surface of the cover 34, and thus sufficient electrostatic force acts on the cover 34, thereby stabilizing the state of attraction to the electrode unit 14.

In addition, the inside of the chamber 3 is maintained at a predetermined pressure through introduction of plasma-dicing processing gas from the processing gas source 9 into the chamber 3 and discharging by the depressurization mechanism 11. Thereafter, high-frequency electrical power is supplied from the first high-frequency power supply unit 7 to the antenna 6 to generate plasma in the chamber 3. The wafer 2 being exposed through the window portion 36 of the cover 34 is irradiated with the plasma. In this state, bias voltage is applied from the second high-frequency power supply unit 22 to the RF electrode 20 of the stage 8. The stage 8 is cooled by the cooling device 17. Any part (street) of the wafer 2 exposed through a mask 3 is removed from a front surface 2a to a back surface 2b due to a physico-chemical effect of radicals and ions in the plasma, so that the wafer 2 is divided into individual chips.

In the above-described plasma dicing, the cover 34, which is made of a material having excellent thermal conductivity, is exposed to the plasma and heated. Accordingly, the heat generated by the plasma is efficiently transferred to the stage 8. In addition, the cover 34 is cooled by coolant supplied to circulate through the second coolant flow path 45. With this configuration, the conveyance carrier 4 suffers no heat damage.

The following describes a problem caused when the cover 34 is entirely cooled unlike the present invention. In the plasma dicing, what is called a BOSCH process in which an etching step and a deposition step are repeated is employed to perform vertical silicon fabrication. In the deposition step, fluorocarbon gas such as C4F8 is used, and thus deposition reaction is likely to occur at a place where the temperature of any member in the chamber 3 is low as compared to a high-temperature place, and as a result, a large amount of deposit is formed at the place. Thus, if the cover 34 is entirely cooled, a larger amount of deposit is formed on the cover 34 including an end portion. Since the end portion of the cover 34 is close to an end portion of the wafer 2, adhesion of a large amount of deposit to the end portion of the cover 34 leads to an anomalous etching shape of the end portion of the wafer 2. In addition, when the deposit adhered to the end portion of the cover 34 accumulates through repetition of processing, an increased amount of fluorocarbon polymer is supplied from the deposit at the end portion of the cover 34. Consequently, as the number of processed wafers increases, for example, generation of residues and etching stop occur near the end portion of the wafer 2, which degrades the reproducibility of etching shape. Moreover, particles are likely to be generated due to peeling-off of the deposit adhered to the back of the end portion of the cover 34.

In the present invention, the range of cooling by coolant extends outside of the position facing to the frame 31 in plan view. This configuration prevents the above-described failure attributable to the deposition generated in the plasma processing and adhering to the lower surface of the cover 34 due to excessive cooling of the inner side of the cover 34. The temperature of the wafer 2 in the plasma dicing is, for example, 20° C. to 60° C., whereas the temperature is, for example, 60° C. to 200° C. at the inner side of the cover 34, and 20° C. to 150° C. outside the cover 34. In this manner, the temperature at the inner side of the cover 34 is preferably at a temperature lower than the temperature outside the cover 34 and slightly higher than the temperature of the wafer 2.

After the plasma dicing is completed, ashing is executed. The inside of the chamber 3 is maintained at a predetermined pressure through introduction of ashing processing gas (for example, oxygen gas) from the ashing gas source 10 into the chamber 3 and discharging by the depressurization mechanism 11. Thereafter, high-frequency electrical power is supplied from the first high-frequency power supply unit 7 to the antenna 6 to generate plasma in the chamber 3. The wafer 2 being exposed through the window portion 36 of the cover 34 is irradiated with the plasma. The plasma irradiation completely removes the mask 3 from the front surface 2a of the wafer 2.

After the ashing, the second drive rod 37 is driven by the second drive mechanism 38 to move the cover 34 from the moved-down position to the moved-up position. Thereafter, the first drive rod 32 is driven by the first drive mechanism 33 to move the conveyance carrier 4 from the moved-down position to the moved-up position. Then, the conveyance carrier 4 is conveyed out of the chamber by the conveyance mechanism (not illustrated).

The present invention is not limited to any configuration described in the embodiment, and various kinds of modifications thereof may be performed.

In the embodiment, the second drive mechanism 38 (moving means or approaching and separating means) moves up and down the cover 34 relative to the stage 8 through the second drive rod 37, but may move up and down the stage 8 relative to the cover 34 fixed in the chamber 3.

In the embodiment, the electrostatic attraction electrode 19 is of a bipolar type, but not limited thereto. The electrostatic attraction electrode 19 may be of a monopolar type.

In the embodiment, the cover 34 is electrostatically attracted. However, the electrostatic attraction of the cover 34 is not essential when mechanical force that presses the cover 34 toward the stage 8 can be applied to the cover 34 through, for example, the second drive rod 37. The electrostatic attraction electrode 19 may be provided at least at a portion covered by the conveyance carrier 4.

In the embodiment, processing executed by the plasma processing device 1 is plasma dicing and ashing, but may be, for example, normal dry etching.

In the embodiment, the plasma processing device 1 is of an ICP-type, but may be of a parallel flat plate type.

Figure 5:
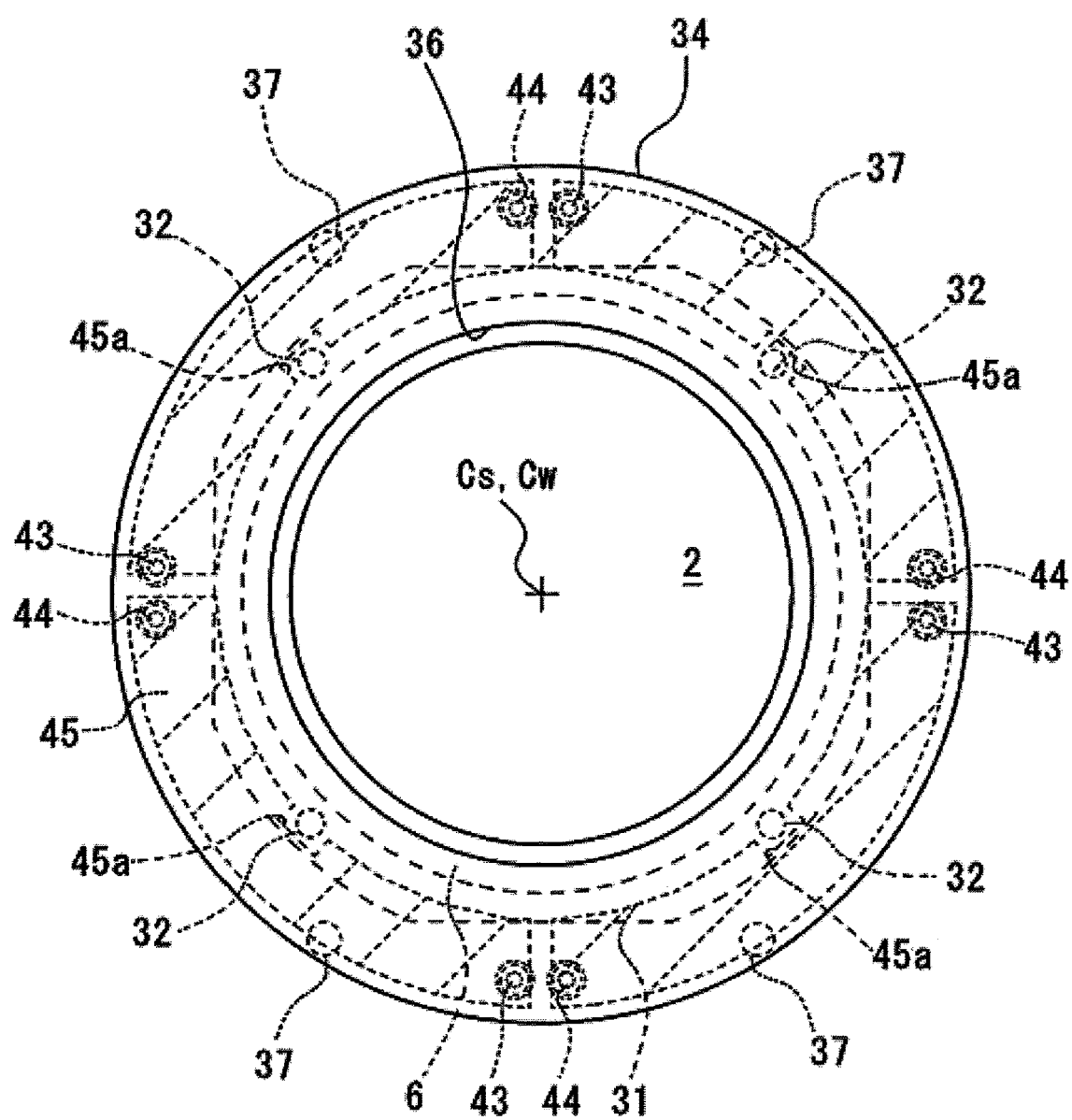
FIG. 5 is a plan view of the cover according to another embodiment.

In the embodiment, the second coolant flow path 45 may be formed outside of the position facing to the frame 31 in plan view, but may be formed outside of a position at which the frame 31 is pressed on the further radially outer side in plan view. In this case, the second coolant flow path 45 preferably has a shape including a cutout portion 45a provided not at any position corresponding to the pressing unit as illustrated in FIG. 5. With this configuration, the second coolant flow path 45 does not interfere with the recesses 39 housing the pressing bodies 40, and thus the thickness of the cover 34 can be reduced.

Figure 6:
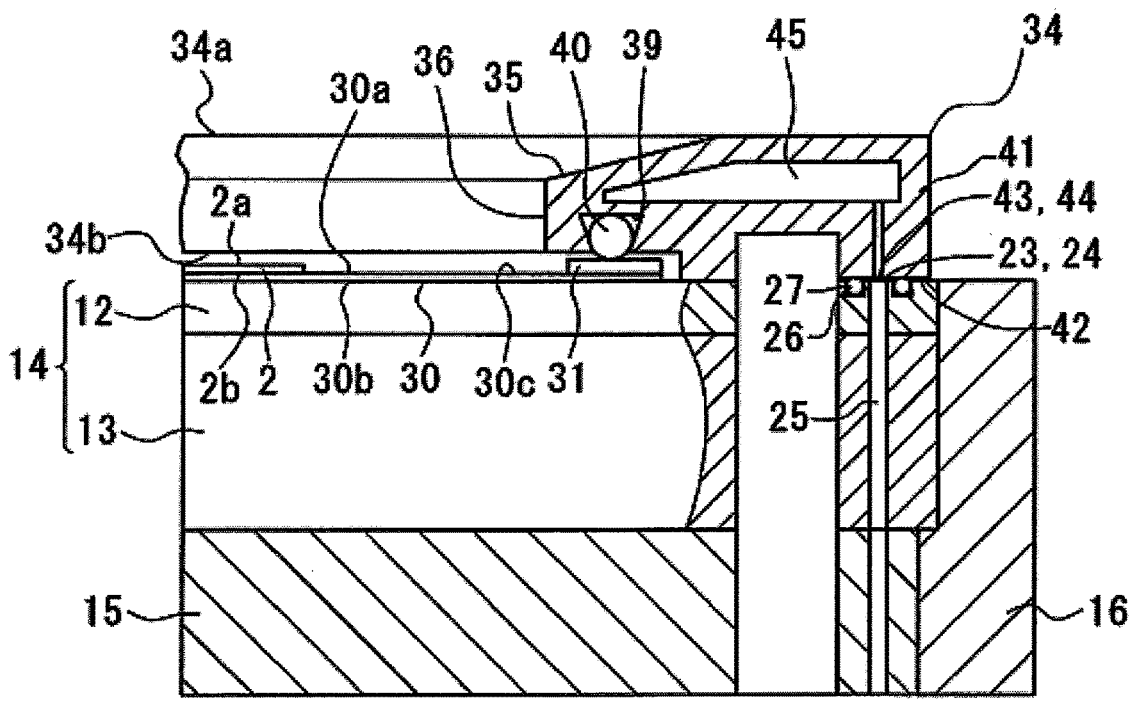
FIG. 6 is a partial enlarged view of the cover and the stage according to another embodiment.

In the embodiment, any exposed part of the holding sheet 30 is covered by the radially inner side of the cover 34, but the inner diameter of the window portion 36 of the cover 34 may be increased to expose the holding sheet 30 as illustrated in FIG. 6. The holding sheet 30 is preferably exposed, for example, when the wafer 2 is so thin that electrical discharging is performed at low output power in a short time, or when excellent properties are required at the edge of the wafer 2.

What is claimed is:

1. A plasma processing device configured to perform plasma processing on a substrate being held by a conveyance carrier including a frame and a holding sheet, the plasma processing device comprising:
    a chamber;
    a plasma source configured to generate plasma in the chamber;
    a stage that is provided in the chamber and on which the conveyance carrier is placed;
    a movable cover placed above the stage to cover the holding sheet and the frame, including a window portion penetrating a thickness direction, including an inner side surrounding the window portion, and formed with a coolant flow path, the inner side of the cover being configured to cover the holding sheet without making contact with the holding sheet;
    a pressing unit arranged in the cover at a position between the inner side of the cover and an outer peripheral portion of the cover, facing to the frame, and configured to contact with the frame by pressing, wherein
    the coolant flow path is formed in a region of the cover on an outer side with respect to the pressing unit in plan view,
    the coolant flow path is not formed in the inner side of the cover in plan view such that the coolant flow path does not overlap with the substrate and the holding sheet inside the frame in plan view,
    the cover includes an introduction port, and a discharge port connected with the introduction port via the coolant flow path, and
    the stage includes a supply port communicated with the introduction port to allow supply of coolant to the coolant flow path when the cover is placed on the stage, and a recovery port communicated with the discharge port to allow recovery of coolant supplied to the coolant flow path when the cover is placed on the stage.

2. The plasma processing device according to claim 1, further comprising a drive rod configured to move the cover relative to the stage to a first position at which the cover and the stage contact with each other and a second position at which the cover and the stage are separated from each other to allow conveyance of the conveyance carrier into and out of the stage.

3. The plasma processing device according to claim 2, wherein the pressing unit includes a plurality of pressing units disposed in a plurality of recesses formed at a plurality of places on the lower surface of the cover on an imaginary circle centered at a center of the cover.

4. The plasma processing device according to claim 1, wherein the pressing unit includes a plurality of pressing units disposed in a plurality of recesses formed at a plurality of places on the lower surface of the cover on an imaginary circle centered at a center of the cover.

* * * * *